(12) United States Patent
Ito

(10) Patent No.: US 7,449,678 B2
(45) Date of Patent: Nov. 11, 2008

(54) OPTICAL ENCODER HAVING REFERENCE POSITION DETECTION

(75) Inventor: Takeshi Ito, Hino (JP)

(73) Assignee: Olympus Corporation, Tokyo (JP)

( * ) Notice: Subject to any disclaimer, the term of this patent is extended or adjusted under 35 U.S.C. 154(b) by 271 days.

(21) Appl. No.: 11/418,532

(22) Filed: May 4, 2006

(65) Prior Publication Data

US 2006/0267822 A1 Nov. 30, 2006

(30) Foreign Application Priority Data

May 26, 2005 (JP) ............................. 2005-153964

(51) Int. Cl.
*G01D 5/34* (2006.01)

(52) U.S. Cl. .................... 250/231.17; 250/231.13

(58) Field of Classification Search ................................
250/231.13–231.18, 237 G, 214 PR; 356/616–617;
33/1 PT, 1 L, 1 N; 341/11, 13
See application file for complete search history.

(56) References Cited

U.S. PATENT DOCUMENTS

| 5,530,543 | A | 6/1996 | Hercher | |
|---|---|---|---|---|
| 7,019,282 | B2 * | 3/2006 | Atsuta et al. | 250/231.16 |
| 7,087,888 | B2 * | 8/2006 | Atsuta et al. | 250/231.13 |
| 7,141,780 | B2 * | 11/2006 | Homer et al. | 250/231.13 |
| 7,348,544 | B2 * | 3/2008 | Atsuta et al. | 250/231.13 |
| 2004/0036016 | A1 * | 2/2004 | Homer et al. | 250/231.13 |
| 2004/0262505 | A1 * | 12/2004 | Atsuta et al. | 250/231.13 |

FOREIGN PATENT DOCUMENTS

JP HEI 8-178613 7/1996

* cited by examiner

*Primary Examiner*—Thanh X Luu
(74) *Attorney, Agent, or Firm*—Scully, Scott, Murphy & Presser, P.C.

(57) ABSTRACT

A photodetector group includes a plurality of photodetector elements which are arranged one-dimensionally in a direction of movement of a scale. An optical encoder includes a differential signal calculating member which calculates a first differential signal of an output signal from one photodetector element and an output signal from other photodetector element, and a gate signal forming member which generates a gate signal which includes an area of zero crossing by the first differential signal, near a position where light emitted from a light source is incident on the photodetector group upon passing through a reference position pattern formed on a scale. The optical encoder outputs a reference position signal based on a point of zero crossing of the first differential signal and the gate signal.

12 Claims, 22 Drawing Sheets

PRIOR ART

PRIOR ART

OPTICAL ENCODER HAVING REFERENCE POSITION DETECTION

CROSS-REFERENCE TO RELATED APPLICATION

The present application is based upon and claims the benefit of priority from the prior Japanese Patent Application No. 2005-153964 filed on May 26, 2005; the entire contents of which are incorporated herein by reference.

BACKGROUND OF THE INVENTION

1. Field of the Invention

The present invention relates to an encoder, and particularly to an optical encoder in which an optical means is used.

2. Description of the Related Art

For detecting an amount of displacement in a straight line direction in a measuring instrument and a stage of a machine tool, or for detecting an angle of rotation in a servo motor etc, a so-called encoder of an optical type and a magnetic type has been hitherto used.

An optical encoder, in general, includes a scale which is fixed to a member such as the stage etc. of which the displacement is to be detected, and a sensor head for detecting a displacement of the scale. The sensor head includes a light emitting section which irradiates light to the scale, and a light receiving section for detecting a light beam which is modulated by the scale. Moreover, a movement of the scale is detected by a change in an intensity of the light beam which is received.

An optical encoder which has a function of detecting a reference position in addition to an amount of movement of the scale is hitherto known. The reference position is used for example, for detecting an origin of the stage etc, or for detecting a critical point of movable range. Therefore, at the time of detecting the reference position, it is sought that there is no wrong detection, and that position repeatability is satisfactory.

As a method of detecting the reference position, a number of methods have been hitherto proposed (Japanese Patent Application Laid-open Publication No. Hei 8-178613 for example). FIG. 21 shows a schematic structure of an optical encoder 10 of a conventional technology. In the optical encoder 10 of the conventional technology, light emitted from a light source is irradiated to the scale (not shown in the diagram). Further, light reflected from the scale is detected by two cell-photodetectors (PD) 11 and 12. Here, the optical encoder 10 has a reference-position detecting function.

The light irradiated from the light source is focused by a reference-position pattern formed on the scale which is not shown in the diagram. Light from the reference-position pattern forms a beam spot 20 on the two cell-photodetectors 11 and 12. Detection signals 11a and 12a output from the two cell-photodetectors 11 and 12 respectively are output to a processing circuit which is not shown in the diagram. The beam spot 20 moves on the two cell-photodetectors 11 and 12 with the movement of the scale, in left and right direction in the diagram which is a direction of movement of the scale. Therefore, when a difference between the output signals 11a and 12a from the two cell-photodetectors 11 and 12 is calculated, a resultant signal is as shown in FIG. 22. As a result of this, a position 50 at which a differential signal performs a zero crossing can be detected as the reference position. Moreover, a photodetector 40 is used for detecting the movement of the scale.

The differential signal for detecting the reference position is a difference between electric outputs from the two cell-photodetectors 11 and 12. Therefore, the differential signal becomes the zero crossing, or the same electric potential thereof, when the beam spot 20 is incident evenly on the two cell-photodetectors 11 and 12, and when the beam spot is not irradiated to either of the cell-photodetectors 11 and 12.

In other words, as shown in FIG. 22, the point 50 (position 50) of zero crossing and points 51a and 51b of zero crossing at both end portions in FIG. 22 cannot be distinguished. Therefore, there is a possibility that in both cases, namely in a case of point 50 being the zero crossing and in a case of other points 51a and 51b being zero crossing, may be detected as the reference position. Particularly, in a stationary state, it is difficult to distinguish the points of zero crossing. In the conventional technology, a judgment of whether or not being the reference position cannot be made without taking an excessive trouble such as moving the scale intentionally to left and right.

Due to such problem, in the abovementioned machine tool, the movement to the reference position, or detection of a desired position in which the reference position is let to be a base becomes inaccurate. Furthermore, due to a defect of processed (finished) good, and a mistake of a working position, there is a possibility of occurring of damage to the apparatus itself.

SUMMARY OF THE INVENTION

The present invention is made in view of the abovementioned issues, and an object of the present invention is to provide an optical encoder, which can easily output the reference position accurately.

To solve the abovementioned issues and to achieve the object, according to the present invention, there can be provided an optical encoder having a reference position detecting function, which includes a light source which irradiates light, a scale on which a periodic optical pattern and at least one reference position pattern are formed, and which moves relatively with respect to the light source, a photodetector for detecting the periodic pattern, which detects light which is irradiated from the light source and passed through the periodic optical pattern, a photodetector for detecting the reference position, which includes a plurality of photodetector elements arranged one-dimensionally in a direction of movement of the scale, and which detects light passed through the reference position pattern, differential signal calculating member which calculates a first differential signal between an output signal from at least one photodetector element from among the plurality of photodetector elements, and an output signal from at least one other photodetector signal different from the one photodetector element, and a gate signal forming member which generates a gate signal which includes at least an area of zero crossing by the first differential signal, near a position where the light emitted from the light source is incident on the photodetector for detecting the reference position via the reference position pattern formed on the scale, and the optical encoder outputs a reference position signal based on the point of zero crossing of the first differential signal the gate signal.

Moreover, according to a preferable aspect of the present invention, it is desirable that the gate signal forming member calculates a first sum signal which is a sum of output signals from at least two photodetector elements not facing an end portion, from among the plurality of photodetector elements arranged one-dimensionally, and a second sum signal which is a sum of output signals from at least other two photodetector elements arranged to sandwich at least the two photodetector elements, and that the gate signal is output based on the first sum signal and the second sum signal.

Moreover, according to another preferable aspect of the present invention, it is desirable that the photodetector for detecting the reference position includes four photodetector elements which are arranged one-dimensionally, the first sum signal is a sum of output signals from two photodetector elements not facing the end portion, from among the four photodetector elements arranged one-dimensionally, and the second Sum signal is a sum of output signals from other two photodetector elements from among the four photodetector elements arranged one-dimensionally, disposed at the end portion respectively and disposed to sandwich the two photodetector elements.

Furthermore, according to still another preferable aspect of the present invention, it is desirable that the gate signal is output based on a magnitude correlation of the first sum signal and the second sum signal.

According to still another preferable aspect of the present invention, it is desirable that a bias voltage is added to at least one of the first sum signal and the second sum signal such that, in an area near the reference position which includes the point of zero crossing of the first differential signal and an area other than the area near the reference position, the magnitude correlation of the first sum signal and the second sum signal is reversed.

Moreover, according to still another preferable aspect of the present invention, it is desirable that the gate signal is output based on a magnitude correlation of a second differential signal obtained by subtracting the second sum signal from the first sum signal, and a third differential signal obtained by subtracting the first sum signal from the second sum signal.

Furthermore, according to still another preferable aspect of the present invention, it is desirable that a reference position of the second differential signal and the third differential signal is set such that in the area near the reference position which includes the point of zero crossing of the first differential signal and in the area other than the area near the reference position, a magnitude correlation of the second differential signal and the third differential signal is reversed.

According to still another preferable aspect of the present invention, it is desirable that a size of a receiving portion of the four photodetector elements is substantially same.

Moreover, according to still another preferable aspect of the present invention, it is desirable that a signal current output from the four photodetector elements is converted to voltage by feedback resistors having a substantially same resistance.

Furthermore, according to still another preferable aspect of the present invention, it is desirable that the four photodetector elements arranged one-dimensionally include a first photodetector element, a second photodetector element, a third photodetector element, and a fourth photodetector element in an order from one of the end portion sides, and the first differential signal is a differential signal of a sum signal of an output of the first photodetector element and an output of the second photodetector element, and a sum signal of an output of the third photodetector element and an output of the fourth photodetector element.

According to still another preferable aspect of the present invention, it is desirable that at least one dummy photodiode each, is connected to at least both end portions of the four photodetector elements which are arranged one-dimensionally.

Moreover, according to still another preferable aspect of the present invention, it is desirable that when a light emission center of the light source and a central point of a joining portion of at least one photodetector element and at least another photodetector element other than the one photodetector element from among the plurality of photodetector elements involved in the calculation of the first differential signal, are connected by a straight line, the straight line and the scale are substantially orthogonal in the direction of movement.

Furthermore, according to still another preferable aspect of the present invention, it is desirable that a slit or a pin hole is formed in an optical path from the light source up to the scale, and the light emission center of the light source is determined by a center of an aperture of the slit or the pin hole.

DETAILED DESCRIPTION OF THE PREFERRED EMBODIMENTS

Embodiments of an optical encoder according to the present invention will be described below in detail with reference to accompanying diagrams. However, the present invention is not restricted to the embodiments described below.

First Embodiment

Figure 1:
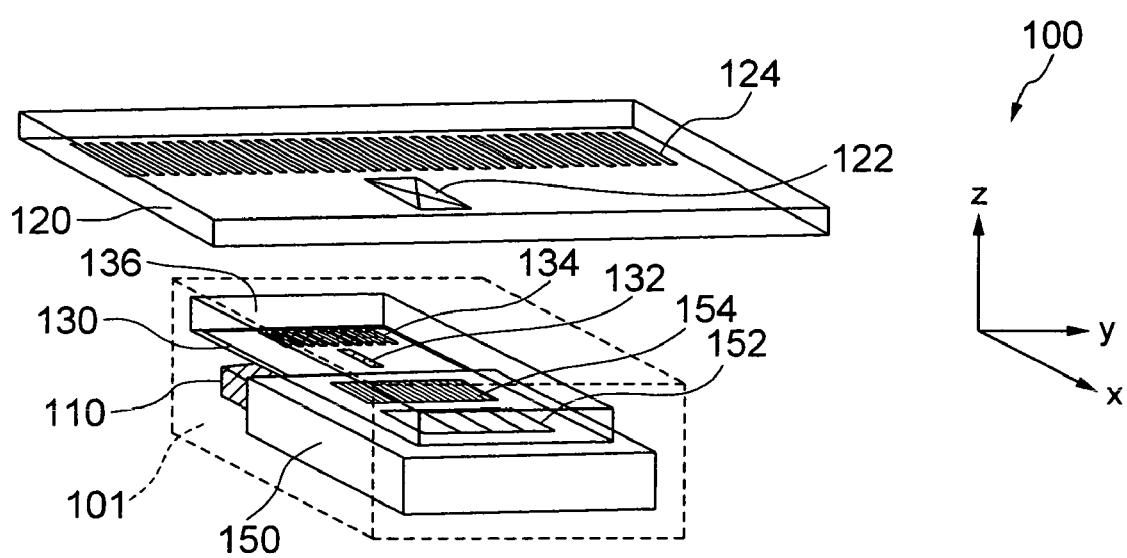
FIG. 1 is a diagram showing a perspective view of a structure of an optical encoder according to a first embodiment of the present invention.
Figure 2:
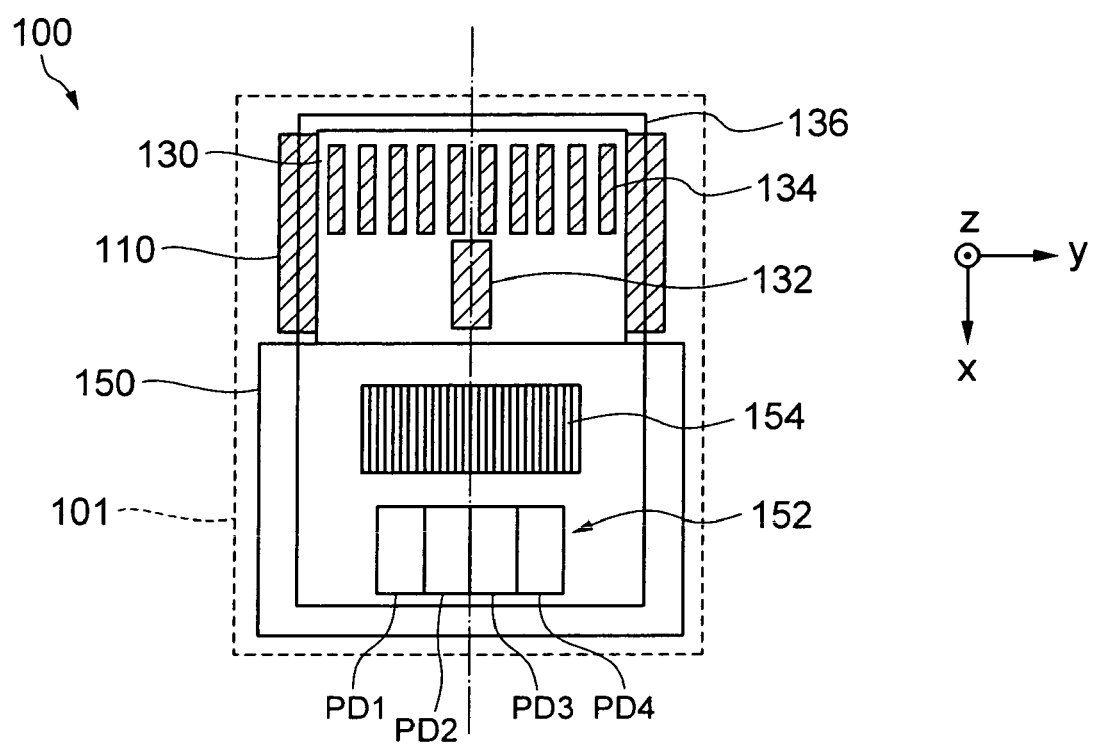
FIG. 2 is a diagram showing a top view of the structure of the optical encoder according to the first embodiment.
Figure 3:
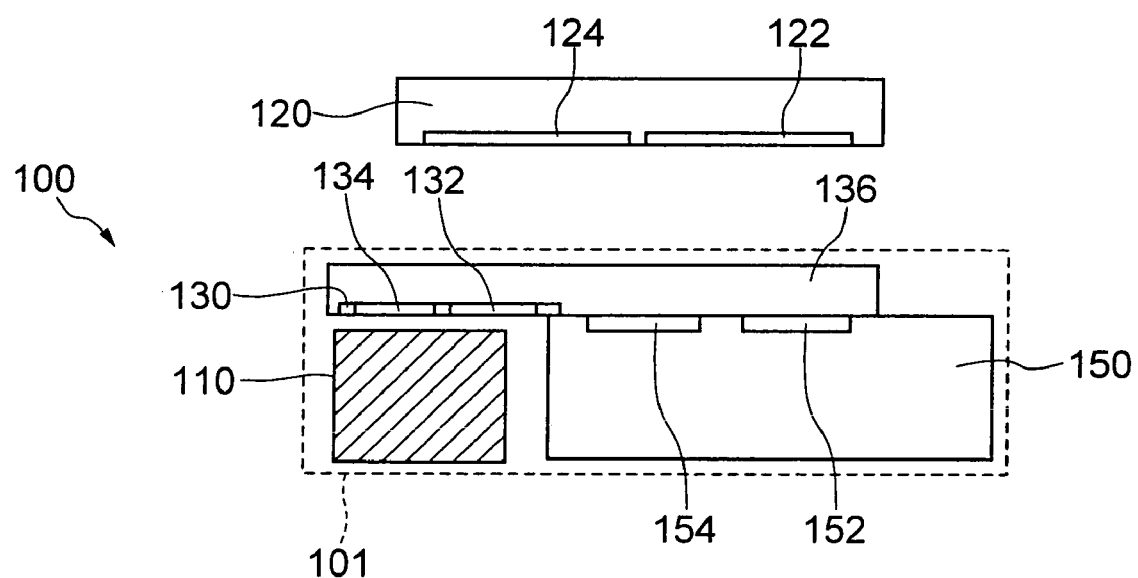
FIG. 3 is a diagram showing a cross-sectional view of the structure of the optical encoder according to the first embodiment.

FIG. 1 is a perspective view showing a schematic structure of an optical encoder 100 according to a first embodiment of the present invention. Moreover, FIG. 2 and FIG. 3 are a top view and a side view respectively, of the optical encoder 100. The optical encoder 100 is a so-called reflecting triple slit type optical encoder.

The optical encoder 100 includes an encoder head 101 and a scale 120. Moreover, the optical encoder 100 detects a direction and an amount of a relative displacement of the encoder head 101 and the scale 120.

The encoder head 101 includes a light source 110, a light source slit 130, and a photodetector 150. The light source slit 130 is formed by patterning a metal film of a metal such as chromium, on a surface of a member having a transparency with respect to a wavelength of light emitted from the light source 110, such as a glass substrate 136. The light source slit 130 is installed at a substantially same height as a height of a surface of the photodetector 150.

Light emitted from the light source 110 is incident on the scale 120 after passing through an aperture 134 or an aperture 132 formed in the light source slit 130. From among the light emitted from the light source 110, light passed through the aperture 134 is irradiated on an optical pattern 124 which is a periodic pattern formed on the scale 120. Light reflected at the optical pattern 124 forms a blight and dark pattern on a photodetector array 154 formed on the photodetector 150. The photodetector array 154 corresponds to a photodetector for detecting the periodic pattern. Here, a wavelength λ of the light emitted from the light source 110, a pitch Pslit of the aperture 134 of the light source slit 130, and a pitch P1 of the periodic optical pattern 124 formed on the scale 120 are set to satisfy requirement of the encoder by the so-called triple grating system.

The photodetector array 154 detects the blight and dark pattern which is formed. Furthermore, the photodetector array 154 outputs an electric signal corresponding to the blight and dark pattern formed, as an encoder signal. As a result of this, it is possible to detect the relative displacement of the encoder head 101 and the scale 120.

Moreover, from among the light emitted from the light source 110, the light passed through the aperture 132 in the light source slit 130 is irradiated toward a reference position pattern 122 formed on the scale 120. The reference position pattern 122 formed on the scale 120 is provided at predetermined locations on the scale 120 as shown in FIG. 1. Therefore, when the scale 120 and the encoder head 101 are at predetermined positions, the light irradiated from the light source 110 is irradiated to the reference position pattern 122. Furthermore, light reflected at the reference position pattern 122 is incident on a photodetector group 152. The photodetector group 152 corresponds to a photodetector for detecting the reference position.

The photodetector group 152 includes four photodetector elements PD1, PD2, PD3, and PD4 arranged one-dimensionally in a direction along y axis. Light incident on the photodetector group 152 moves on the photodetector group 152 with the movement of the scale 120.

For example, when the scale is moved in y direction from left to right in FIG. 2, a light spot reflected at the reference position pattern 122 is first incident on the photodetector element PD1. Further, with the relative displacement of the scale 120, a position of incidence of the light spot moves in an order of the photodetector elements PD2, PD3, and PD4.

Figure 4:
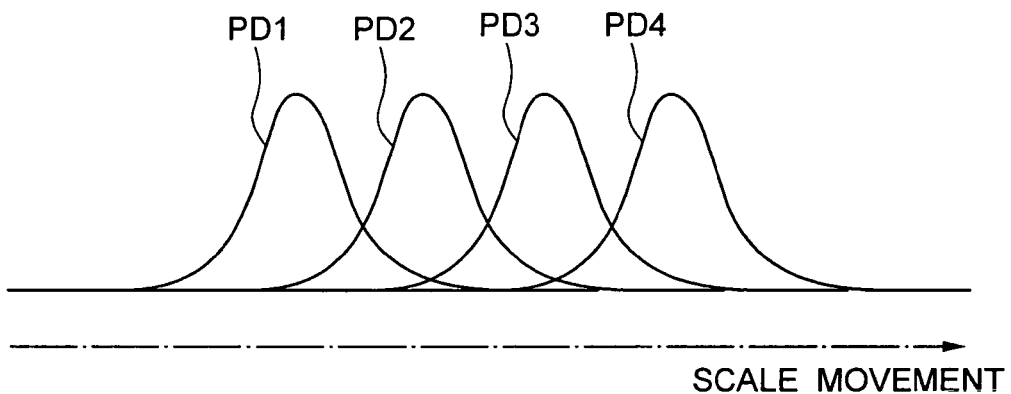
FIG. 4 is a diagram showing an output signal.

FIG. 4 shows an example of output signals from the photodetector elements PD1, PD2, PD3, and PD4 respectively. Reference numerals PD1, PD2, PD3, and PD4 of the photodetector elements are assigned to a wavelength of the output signal and shown. In the first embodiment, each of the photodetector elements PD1, PD2, PD3, and PD4 have the same shape and the same size. Therefore, the signals output also have substantially the same shape. As a result of this, a position of the signal output is shifted only by a portion equivalent to a position at which the photodetector elements PD1, PD2, PD3, and PD4 are disposed.

Based on the output from the four photodetector elements PD1, PD2, PD3, and PD4, three analog signals namely VZ, VM12bias, and VRL shown in FIG. 6A to FIG. 6E are output by calculation according to the following equations (1) to (4).

$$VZ = V(PD2) - V(PD3) + V\text{ref} \quad (1)$$

$$VM12 = V(PD1) + V(PD4) \quad (2)$$

$$VM12\text{bias} = VM12 + V\text{bias} \quad (3)$$

$$VRL = V(PD2) + V(PD3) \quad (4)$$

Here,

V(PD1) denotes a signal obtained upon converting an output signal from the photodetector element PD1 to voltage, V(PD2) denotes a signal obtained upon converting an output signal from the photodetector element PD2 to voltage, V(PD3) denotes a signal obtained upon voltage converting an output signal from the photodetector element PD3 to voltage, V(PD4) denotes a signal obtained upon voltage converting an output signal from the photodetector element PD4 to voltage, Vref denotes an intermediate electric potential regulated separately, which becomes a reference, and Vbias denotes a bias voltage added to VM12.

Figure 5:
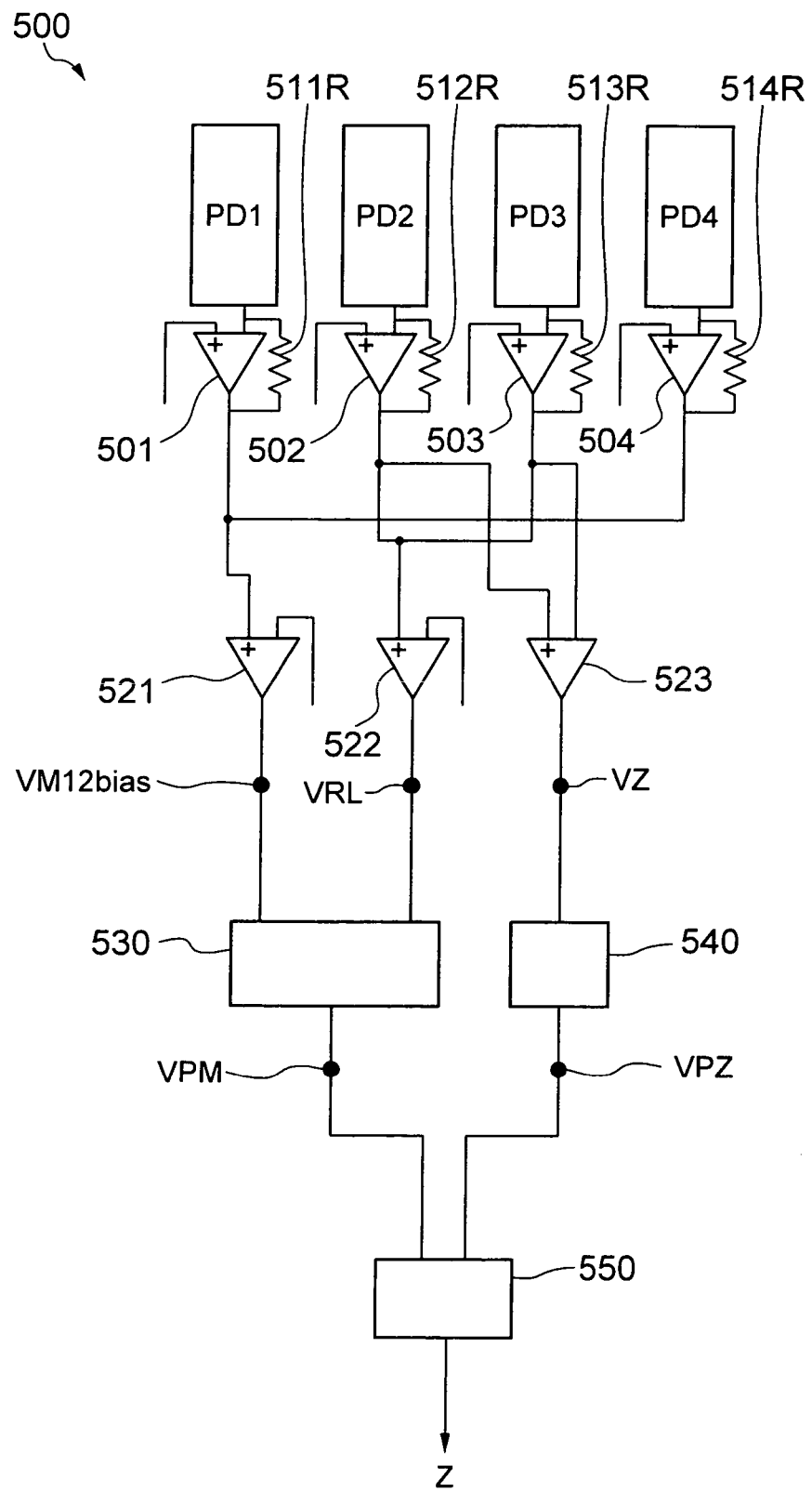
FIG. 5 is a diagram showing a circuit structure of the optical encoder according to the first embodiment.
Figure 6A:
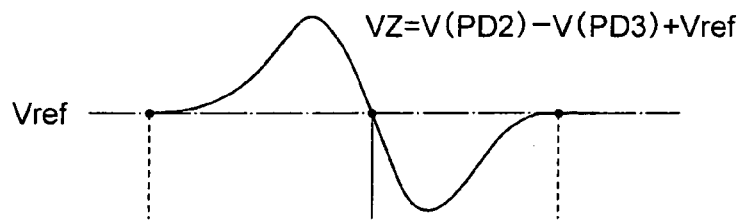
FIG. 6A to FIG. 6E are diagrams showing signals generated in the first embodiment.
Figure 6B:
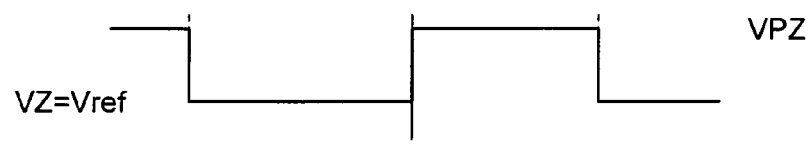
Figure 6C:
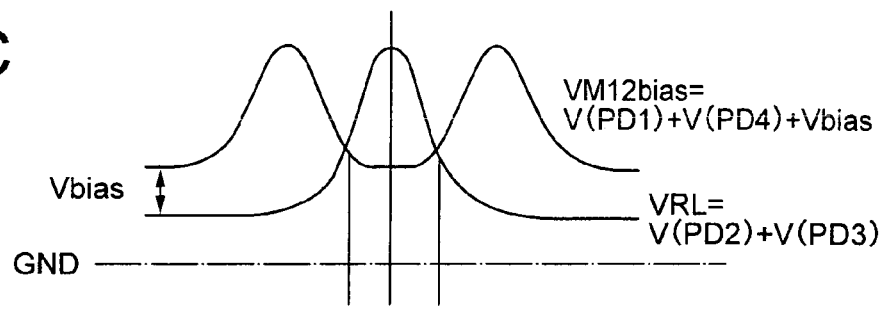
Figure 6D:
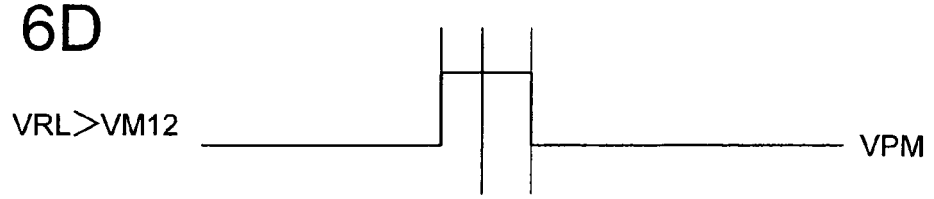
Figure 6E:
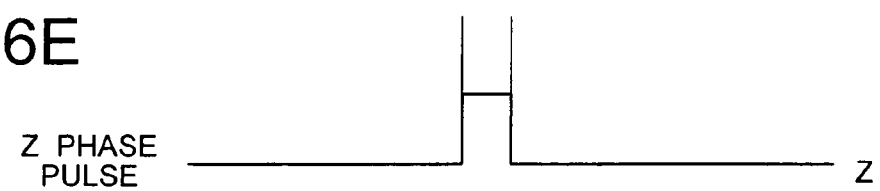

For having such output, a circuit shown in FIG. 5 for example is used. The output signals from the photodetector elements PD1, PD2, PD3, and PD4 are input to operational amplifiers 501, 502, 503, and 504 respectively. The operational amplifiers 501, 502, 503, and 504 convert a signal current to voltage by feedback resistors 511R, 512R, 513R, and 514R having a substantially equal resistance. An operational amplifier 523 corresponds to a differential signal calculating means (member).

Furthermore, operational amplifiers 521, 522, and 523 output the signals VM12bias, VRL, and VZ respectively. The signal VRL corresponds to a first sum signal. The signal VM12 corresponds to a second sum signal. A gate signal generating circuit 530 outputs a gate signal VPM based on the signals VM12bias and VRL. A pulse converting circuit 540 convert the signal VZ to pulse, and outputs a signal VPZ. An AND circuit 550 performs an AND operation on the signal VPM and the signal VPZ, and outputs a signal Z. In FIG. 5, a conventional method being used for adding the Vref and the Vbias, the description is omitted in this diagram.

As shown in FIG. 6A to FIG. 6E, the output signal VZ is changed up and down with a reference voltage Vref as a center, at a point of zero crossing. The output signal VZ corresponds to a first differential signal. Moreover, the signal VM12bias is a signal having two peaks. The signal VRL is a signal having one peak at a position sandwiched between the two peaks of the signal VM12bias.

Here, in an area away from the reference position, an external light of substantially same amount is incident on the photodetector elements PD1, PD2, PD3, and PD4. Therefore, when a bias voltage Vbias is not to be added to a signal VM12, the signal VRL and the signal VM12 become the outputs of substantially equal magnitude.

Therefore, Vbias is set such that in an area other than the reference position, VRL<VM12bias, and in an area between the two peaks of the signal VM12, which is an area near the reference position, VRL>VM12bias. Further, this is added to the signal VM12.

Here, a method of detecting the reference position according to the first embodiment will be described in further detail with reference to FIG. 6A to FIG. 6E. To start with, the gate signal VPM will be described below. The gate signal VPM is a signal which shows whether or not being an area near the reference position by becoming High near the reference position and becoming Low in an area other than the reference position. The gate signal VPM is generated from a magnitude correlation of the signal VM12bias and the signal VRL. The bias voltage Vbias is set such that with the two signals VM12bias and the VRL, VM12bias>VRL in the area other than the reference position, and VM12bias<VRL in the area near the reference position. Therefore, a pulse signal which becomes High in the area where VM12bias<VRL, and in other words the gate signal VPM which becomes High only in the area near the reference position, can be achieved.

Next, the signal VPZ which starts up in the area near the reference position will be described. Based on the signal VZ which is an output of a difference between the signal V(PD2) and the signal V(PD3), a pulse signal VPZ which starts up at a point of zero cross, in other words, which starts up at VZ=Vref, is generated.

Figure 7A:
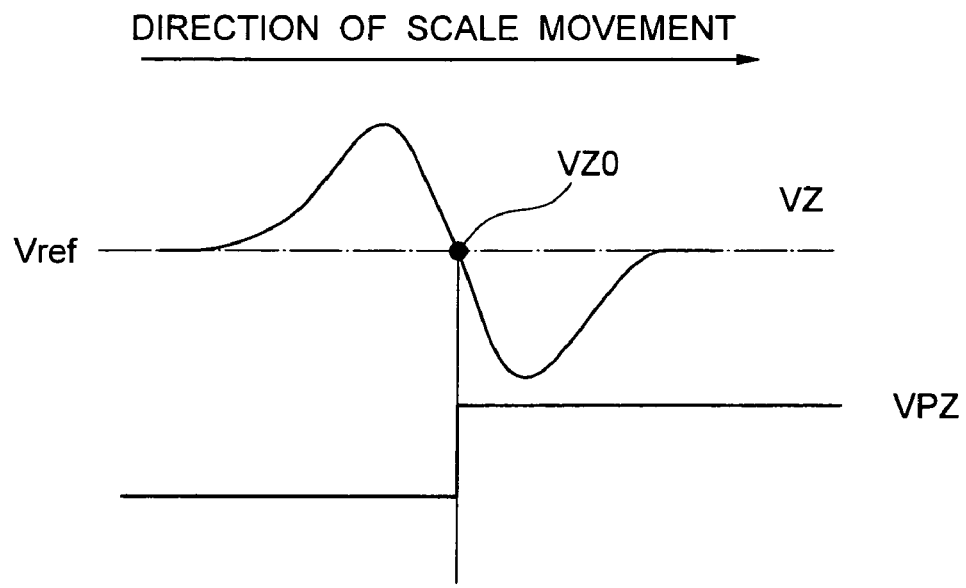
FIG. 7A and FIG. 7B are diagrams showing a relation between a direction of movement of a scale and an output signal.
Figure 7B:
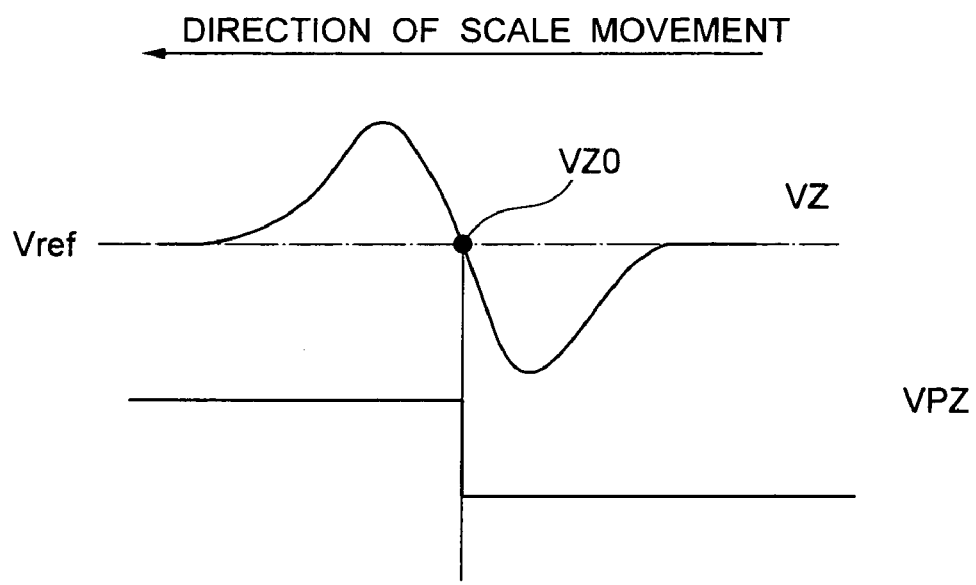

An algorithm of output is designed such that the signal VPZ starts up at the point of zero crossing irrespective of the direction of movement of the scale 120 as shown in FIG. 7A and FIG. 7B. For example, the direction of movement of the scale 120 is calculated from an order of appearance of a peak and a bottom of the signal VZ, or the encoder signal described earlier. Further, from the direction of movement of the scale 120 and the signal VZ, the signal VPZ which starts up at the zero crossing irrespective of the direction of movement of the scale 120 can be output. Therefore, a start-up point of the pulse signal VPZ is the zero crossing which becomes the reference position irrespective of the direction of movement of the scale 120.

By computing an overlapping (AND operation) of the gate signal VPM and the zero crossing signal VPZ, the signal Z which is a reference position pulse signal is output. The signal VPZ sometimes becomes High even in the area other than the reference position. However, the a situation in which the gate signal VPM is High, and also the signal VPZ is High, occurs only at the reference position. As a result of this, it is possible to achieve a stable reference position signal.

Moreover, for generating the gate signal VPM from the signal VRL and the signal VM12bias which is an analog signal, or for outputting the reference position pulse signal VPZ from the analog signal VZ, a comparator for example, can be used. In this case, it is preferably desirable to allow the comparator to have a hysterisis. Accordingly, it is possible to stabilize a start-up time and a trailing edge of the pulse.

Moreover, in the first embodiment, the bias voltage Vbias is added only to the signal VM12. Without restricting to adding the bias voltage Vbias to the signal VM12, and by adding the bias voltage Vbias also to the signal VRL, the signal can be stabilized. At this time, it is preferably desirable that a difference in values of the bias voltage added to both the signals VM12 and VRL is let to be Vbias.

Moreover, it is desirable that a straight light linking a center of the aperture 132 for detecting reference position of the light source slit 130 and a portion of contact of the photodetector element PD2 and the photodetector element PD3 in the photodetector group 152 is substantially orthogonal with respect to the direction of movement of the scale 120. By disposing in such manner, light can be irradiated equally or centrosymmetrically to the four photodetector elements PD1, PD2, PD3, and PD4. In other words, as shown in FIG. 4, it is possible to realize that each signal output from each of the photodetector elements PD1, PD2, PD3, and PD4 has the equal size, or the signals output from the photodetector elements PD2 and PD3 have substantially equal size and the signals output from the photodetector elements PD1 and PD4 have substantially equal size.

In the first embodiment, with the abovementioned structure, it is possible to reduce the generation of a wrong pulse in the area other than the reference position. As a result of this, it is possible to provide an optical encoder which can easily output the reference position accurately.

Second Embodiment

An optical encoder according to a second embodiment of the present embodiment will be described below by referring to FIG. 9A to FIG. 9E. In the second embodiment, a structure of a signal processing circuit which forms a gate signal from an electric signal which is output from the photodetector elements PD1, PD2, PD3, and PD4 in the photodetector group 152 differs from the structure in the first embodiment. The same reference numerals are used for components same as in the first embodiment and the description of such components is omitted to avoid repetition.

For forming the gate signal, in the second embodiment, the signal VM12 and the signal VRL are formed by the abovementioned equations (2) and (4). Further, by using the signal VM12 and the signal VRL, outputs VRL(+) and VRL(−) for forming the gate signal are generated as shown in the following equations (5) and (6). The output VRL(+) corresponds to the second differential signal. The output VRL(−) corresponds to a third differential signal.

$$VRL(+)=VRL-VM12+Vref \quad (5)$$

$$VRL(-)=VM12-VRL+Vref \quad (6)$$

In an area away from the reference position, the signal VRL(+) and the signal VRL(−) becomes VRL(+)=VRL(−). Here, the gate signal is formed from a magnitude correlation of the VRL(+) and the VRL(−). Therefore, in the area away from the reference position, it is preferable that VRL(+)=VRL(−). Therefore, Vbias2 is set newly. Further, as according to equations (7) and (8), by adding or subtracting the Vbias 2 to or from the signals VRL(+) and VRL(−), output signals VRL(+)bias and VRL(−)bias are generated.

$$VRL(+)bias=VRL(+)-Vbias2 \quad (7)$$

$$VRL(-)bias=VRL(-)+Vbias2 \quad (8)$$

Figure 8:
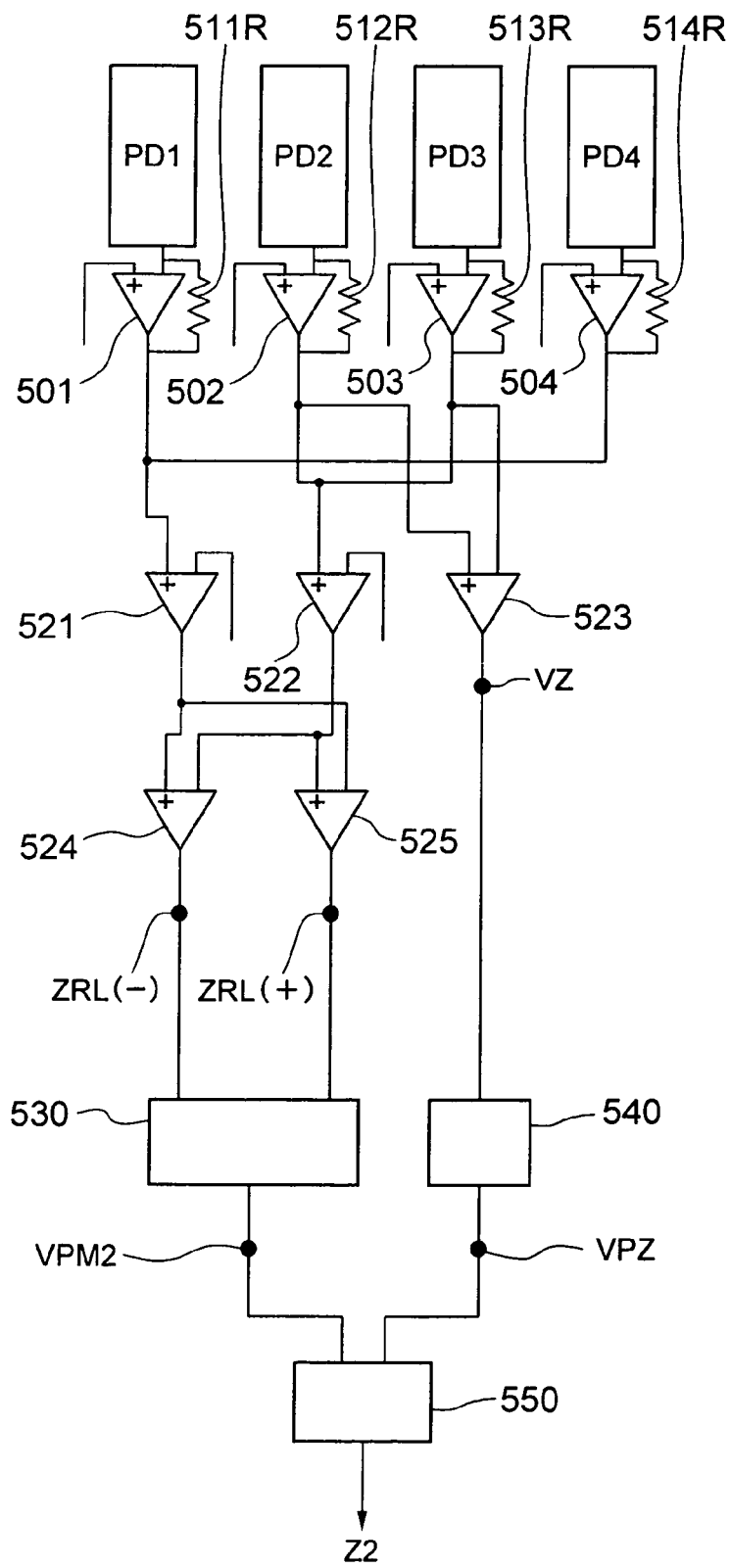
FIG. 8 shows a circuit structure of an optical encoder according to a second embodiment.

FIG. 8 is an example of a circuit structure for the above-mentioned calculations. In the circuit shown in FIG. 8, operational amplifiers 524 and 525 are provided additionally to the circuit shown in FIG. 5. In FIG. 8, a normal method being used for adding the signals Vref and Vbias2, the description is omitted.

Next, a method for generating a reference position signal in the second embodiment will be described by using FIG. 9A to FIG. 9E. In FIG. 9A to FIG. 9E, the signals VZ and VPZ being the same as in the first embodiment, the description is omitted to avoid repetition.

The signals VRL(+)bias and VRL(−)bias will be described. The signal Vbias2 is set such that in the area away from the reference position area, VRL(+)bias<VRL(−)bias, and in the area near the reference position, VRL(+)bias>VRL(−)bias. By setting the Vbias2 in such manner, the analog signals VRL(+)bias and VRL(−)bias are output as shown in FIG. 9C. Furthermore, a gate signal VPM2 is output such that the gate signal VPM2 becomes High in VRL(+)bias>VRL(−)bias, and low in an area other than the area of VRL(+)bias>VRL(−)bias.

Here, in the second embodiment, each of the photodetector elements PD1, PD2, PD3, and PD4 in the photodetector group 152 has the same size and the same shape. Therefore, a magnitude of current other than signal current due to light other than a signal component incident on the photodetector elements PD1, PD2, PD3, and PD4, such as an external light incident on each of the photodetector elements PD1, PD2, PD3, and PD4 is substantially the same. Moreover, both the signals VRL and VM12 are sum signals of two photodetector elements. Therefore, the current other than the signal current of these signals is substantially the same. Therefore, as equations (5) and (6), by calculating a differential signal of the signals VRL and VM12, it is possible to remove a component of current other than the signal current. Accordingly, it is possible to output a stable gate signal which is not affected by the external light etc.

Figure 9A:
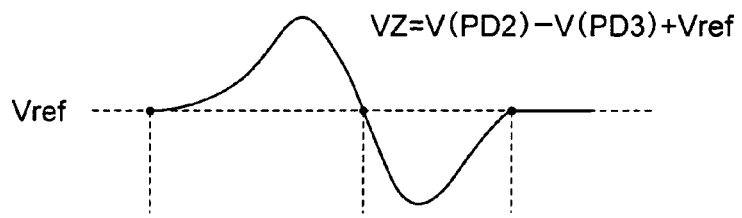
FIG. 9A to FIG. 9E are diagrams showing signals generated in the second embodiment.
Figure 9B:
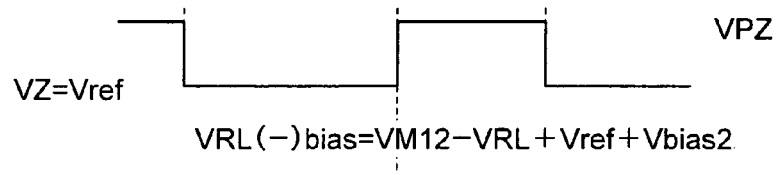
Figure 9C:
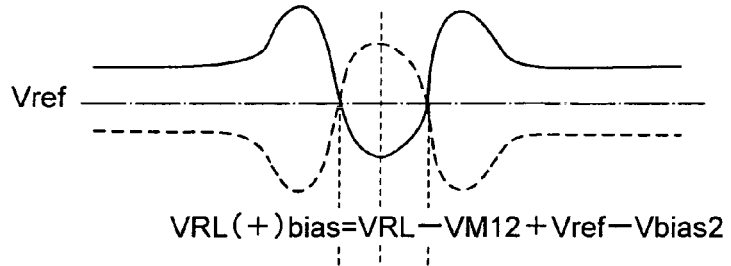
Figure 9D:
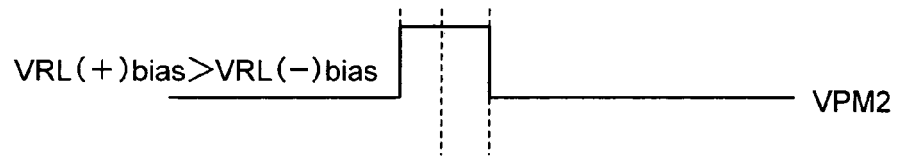
Figure 9E:
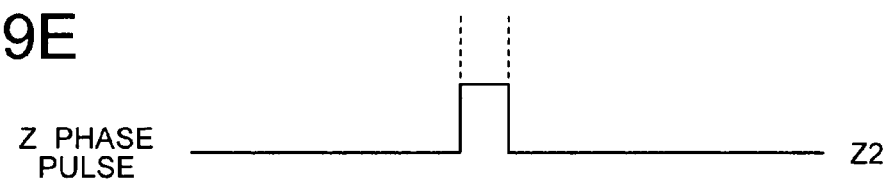

Accordingly, as shown in FIG. 9B, FIG. 9D, and FIG. 9E, it is possible to output stably a reference position pulse signal Z2 from the overlapping of a reference position signal VPZ and a gate signal VPM2. In the second embodiment, the bias voltage Vbias2 of the same magnitude is added or subtracted to or from both the signal VRL(+) and the signal VRL(−). Here, in the addition and the subtraction, it is not necessarily be the same voltage. Furthermore, the bias voltage Vbias2 may be added or subtracted to or from any one of the signal VRL (+) or the signal VRL(−).

With a structure as in the second embodiment, it is possible to achieve an optical encoder which outputs a stable reference position signal which is not susceptible to influence of the external light etc.

Third Embodiment

Next, a third embodiment of the present invention will be described while referring to FIG. 10 and FIG. 11. In the third embodiment, an output method of a reference position signal VZ differ from the output method in the first and the second embodiments shown in FIG. 6A to FIG. 6E, and FIG. 9A to FIG. 9E.

An output method of a reference position signal VZ2 in the third embodiment will be described while referring to FIG. 10. The reference position signal VZ2 is output based on equation (9).

$$VZ2 = V(PD1) + V(PD2) - V(PD3) - V(PD4) \quad (9)$$

Figure 10:
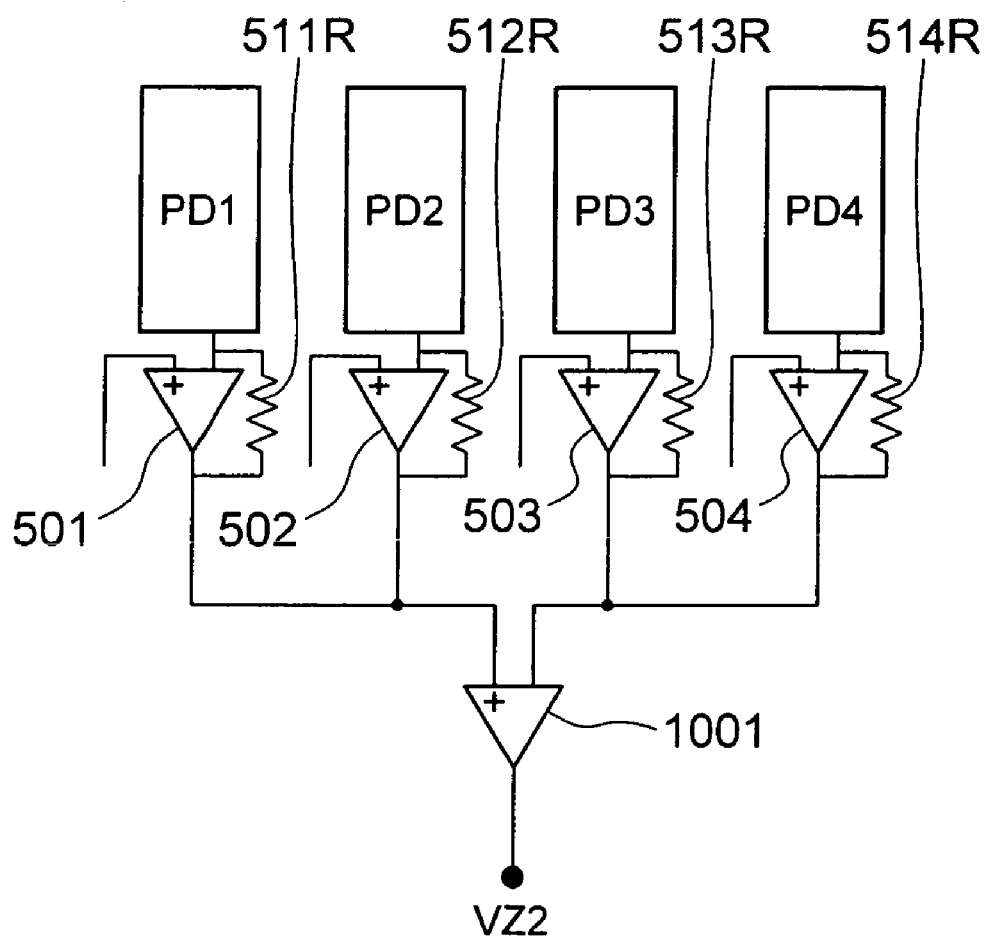
FIG. 10 is diagram showing a circuit structure of an optical encoder according to a third embodiment.

The reference position signal VZ2 output in such manner, when compared with the reference position signal VZ used in the first embodiment and the second embodiment, can be generated by providing an operation amplifier 1001 shown in FIG. 10. FIG. 11 shows a comparison between the signal VZ2 and the signal VZ at the same conditions as in the first and the second embodiment. As it is clear from FIG. 11, amplitude of the reference position signal can be increased without changing a position accuracy of the zero crossing point. Accordingly, the optical encoder is structured such that it cannot be affected easily by noise etc.

Figure 11:
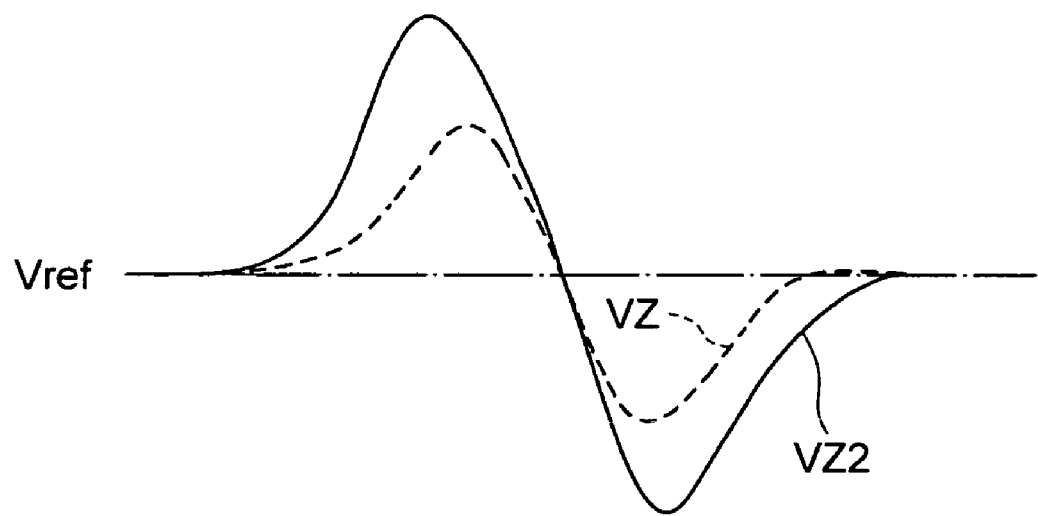
FIG. 11 is a diagram showing signals generated in the third embodiment.

The signal VZ2 as shown in FIG. 11 can be achieved similarly when a dimension of the photodetector elements PD2 and PD3 is increased with respect to the direction of movement of the scale 120. However, in the third embodiment, the similar effect can be achieved without increasing intentionally the dimension of the photodetector elements PD1, PD2, PD3, and PD4. Therefore, the photodetector elements PD1, PD2, PD3, and PD4 in the photodetector group 152 for forming the gate signal can be used effectively.

In the third embodiment, by structuring the optical encoder in such manner, sufficient signal intensity can be achieved without increasing an amplification factor of the signal.

Fourth Embodiment

Next, an optical encoder according to a fourth embodiment of the present invention will be described while referring to FIG. 12 and FIG. 13. In the present embodiment, a basic structure is similar to the structure in the first embodiment. Moreover, a calculation method of signal is formed to be applicable to any of the first embodiment, the second embodiment, the third embodiment and the fourth embodiment.

Figure 12:
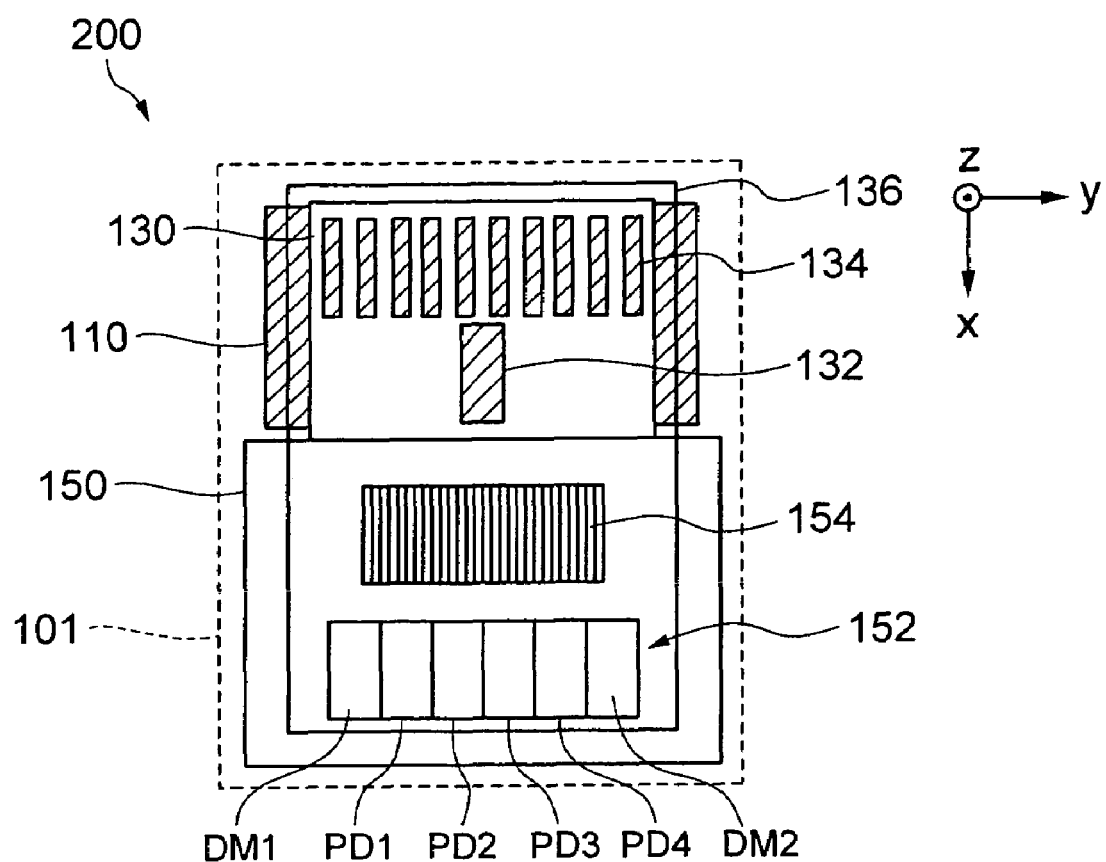
FIG. 12 is a diagram showing a top view of a structure of an optical encoder according to a fourth embodiment.
Figure 13:
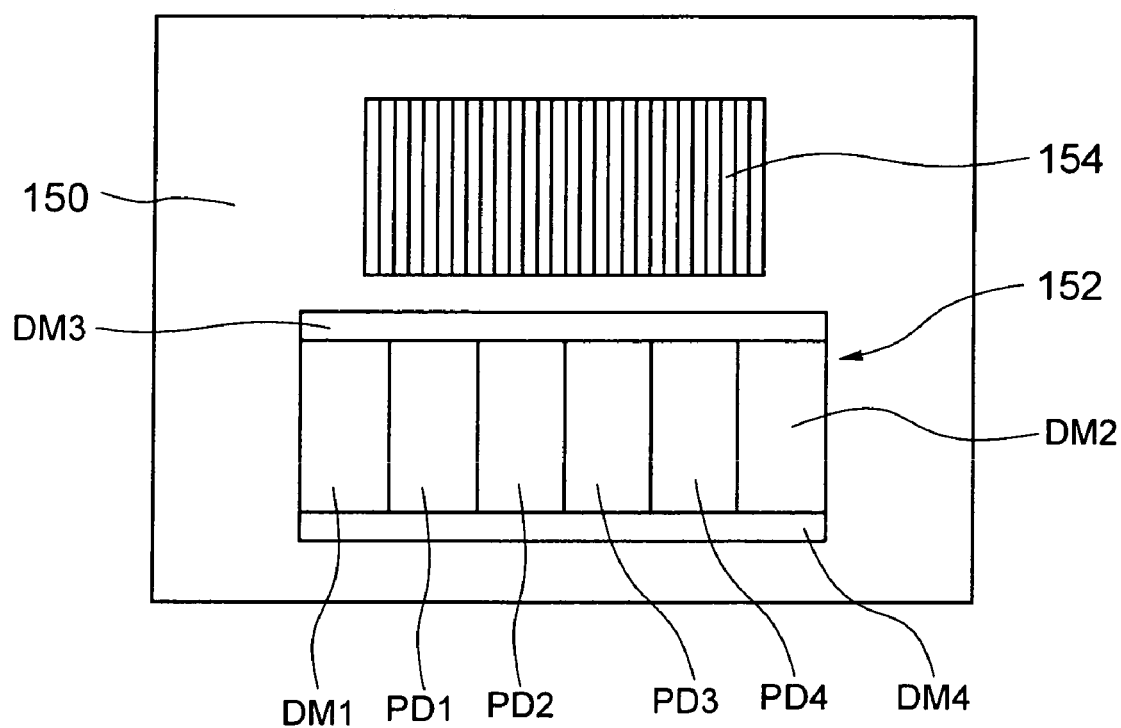
FIG. 13 is a diagram showing a top view of a structure of an optical encoder according to a modified embodiment of the fourth embodiment.

In the fourth embodiment, as shown in FIG. 12, dummy photodetectors DM1 and DM2 are provided at both ends of the four photodetector elements PD1, PD2, PD3, and PD4 in the photodetector group 152 for detecting the reference position.

A normal photodetector element outputs current corresponding to light incident on a light receiving surface. At this time, when light is irradiated on an area around the photodetector element, unnecessary photoelectric current is generated in a semiconductor substrate. A part of the unnecessary photoelectric current generated, flows to the photodetector element. Therefore, the part of the unnecessary photoelectric current generated is output as if light is incident on the light receiving surface of the photodetector, which is a problem.

In the fourth embodiment, at least one of dummy photodetector DM1 and DM2 is connected to both end portions of the four photodetector elements PD1, PD2, PD3, and PD4 arranged one-dimensionally.

The photodetector element PD2 is disposed such that both ends of the photodetector element PD2 are sandwiched between the other photodetector element PD1 and PD3. Similarly, the photodetector element PD3 is disposed sandwiched between the photodetector elements PD2 and PD4. Therefore, regarding the photodetector elements PD2 and PD3, the unnecessary photoelectric current generated in the area around the photodetector elements flows only from a vertical direction in FIG. 2 (x direction).

Whereas, in a case of the photodetectors PD1 and PD4, in addition to an upper and a lower sides of the photodetectors PD1 and PD4 (x direction), one of the ends (y direction) is connected to an area where the photodetector element is not formed. In other words, three sides of the rectangular photodetector elements PD1 and PD4 are connected to the area in which the photodetector element is not formed.

Therefore, when light of substantially even quality is irradiated on the photodetector group 152, due to the output of the photodetector elements PD2 and PD3, the outputs of the photodetector elements PD1 and PD4 are seemed to have increased.

Therefore, as shown in FIG. 12, the dummy photodetectors DM1 and DM2 are provided at both ends of the photodetector group 152. Accordingly, when the light of substantially even quality is irradiated on the photodetector group 152, it is possible to make the output of the photodetector elements PD1, PD2, PD3, and PD4 to be substantially equal. A size and a shape of the dummy photodetectors DM1 and DM2 may be such that there is sufficient width in the direction of movement of the scale 120 (y direction). For example, the dummy photodetectors DM1 and DM2 having the same size and shape as the size and the shape of the other photodetector elements PD1, PD2, PD3, and PD4 can be used.

Moreover, when the width (length in y direction) of the dummy photodetectors DM1 and DM2 is not sufficient, it is desirable to dispose a plurality of dummy photodetectors continuously in y direction, at the end portions of the photodetector elements PD1 and PD4.

In the fourth embodiment, the dummy photodetectors DM1 and DM2 are provided only to the both ends of the photodetector group 152. However, without restricting to providing the dummy photodetectors DM1 and DM2 only to the both ends of the photodetector group 152, dummy photodetector elements DM3 and DM4 can be disposed further in a vertical direction as shown in FIG. 13. Accordingly, it is possible to output even more stable reference position signal and gate signal.

By structuring the optical encoder in such way, it is possible to make equal an effective light receiving sensitivity of the photodetector elements PD1, PD2, PD3, and PD4 in the photodetector group 152 for detecting the reference position. As a result of this, it is possible to output even more stable reference position signal and gate signal.

Fifth Embodiment

Next, a fifth embodiment of the present invention will be described while referring to FIG. 14. A basic structure and operation of the fifth embodiment is the same as the structure and operation of the first embodiment. In the embodiments from the first embodiment to the fourth embodiment, the optical encoder has a structure in which the light source 110 and the light source slit 130 are combined. Whereas, the fifth embodiment differs at a point that a point light source, such as a surface emitting laser or a current confinement structure LED is used.

Figure 14:
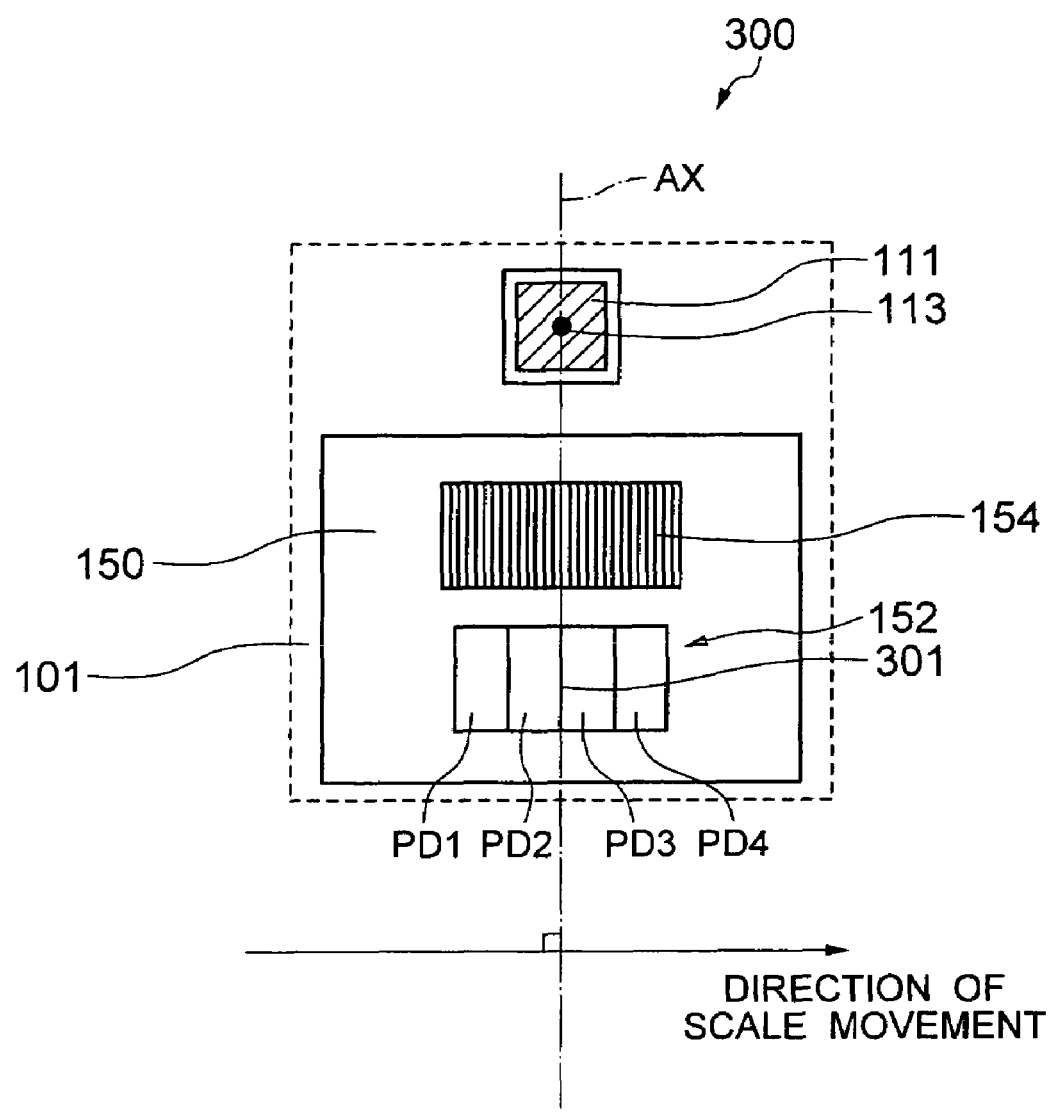
FIG. 14 is a diagram showing a top view of a structure of an optical encoder according to a fifth embodiment.

A top view of an optical encoder 300 according to the fifth embodiment is shown in FIG. 14. Instead of the light source 110 and the light source slit 130, a point light source 111 and an emitting window 113 are disposed. A positional relation of the point light source 111, the optical pattern 124 formed on the scale 120, and the photodetector array 154 which is the photodetector for detecting the period pattern, and a relation of an oscillation wavelength of light emitted from the point light source 111, the pitch P1 of the periodic optical pattern 124, and the blight and dark pattern which is detectable by the photodetector array 154, forms a so-called talbot image, and are structured to be detectable. At this time, a blight and dark pattern substantially similar to the blight and dark pattern in the encoder of a triple grating system can be formed and detected.

Moreover, an arrangement can be made such that light beam emitted from the point light source 111 is irradiated on the reference position pattern 122 formed on the scale 120, and light reflected at the reference position pattern 122 is irradiated on the photodetector group 152 which is a photodetector for detecting the reference position. Accordingly, the reference position can be detected by a method described in the embodiments from the first embodiment to the fourth embodiment.

Moreover, when the emitting window 113 which is a light emission center of the point light source 111 and a central point of a joining portion 301 of at least one photodetector element PD2 and at least another photodetector element PD3 different from the one photodetector element from among the plurality of photodetector elements are connected by a straight line AX, the straight line AX and the scale 120 are substantially orthogonal in the direction of movement y.

Here, sometimes a divergent angle of light beam irradiated from the point light source 111 being small, the light is not irradiated sufficiently to the four photodetector elements PD1, PD2, PD3, and PD4. Even in such case, by structuring the optical encoder as described above, centrosymmetrical light can be irradiated to the four photodetector elements PD1, PD2, PD3, and PD4. As a result of this, in other words, as shown in FIG. 4, regarding the signal output from each of the photodetector elements PD1, PD2, PD3, and PD4, the signal from the photodetector element PD2 and the photodetector element PD3 can be made to be substantially the same. Moreover, the signal from the photodetector element PD2 and the signal from the photodetector element PD4 can be made to be substantially the same.

By structuring the optical encoder as in the fifth embodiment, it is possible to realize an optical encoder with less number of parts and reduced size.

Figure 15:
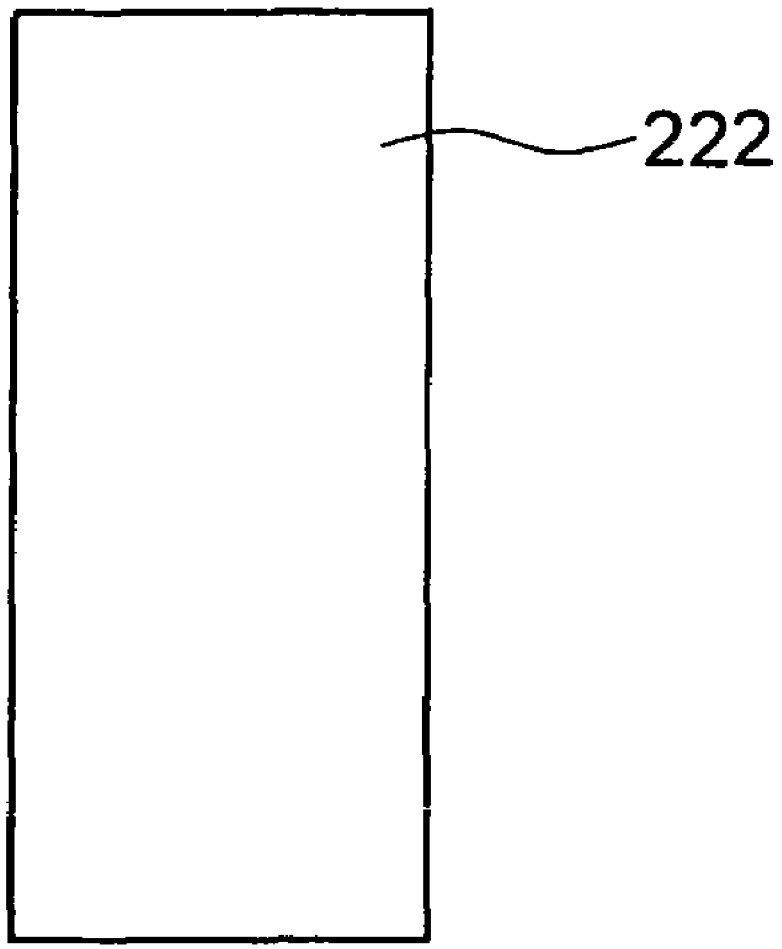
FIG. 15 is a diagram showing an aperture of an optical encoder according to a modified embodiment.
Figure 16:
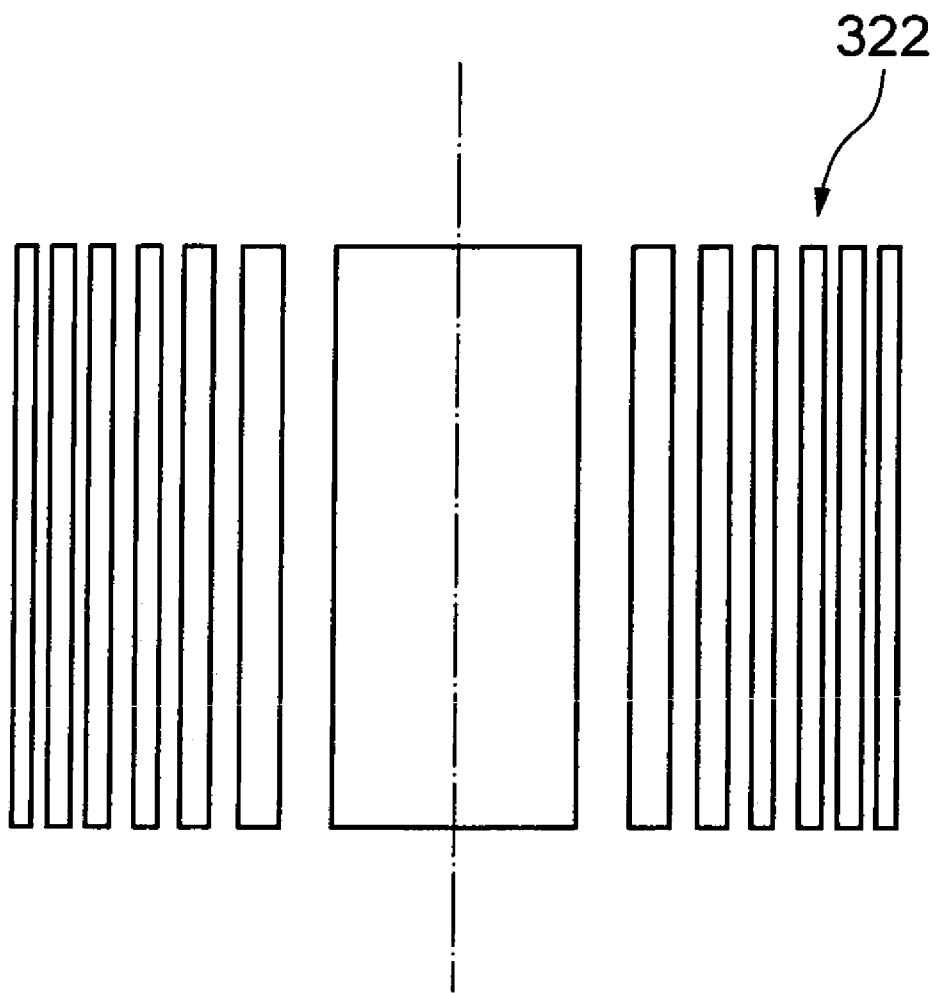
FIG. 16 is a diagram showing an aperture of an optical encoder according to another modified embodiment.

In the embodiments from the first embodiment to the fifth embodiment, various examples of structures can be formed for the reference position pattern 122 formed on the scale 120. For example, it may be a single reflection pattern 222 as shown in FIG. 15. Or, it may be structured as a holographic lens 322 having a diffraction pattern as shown in FIG. 16. Furthermore, the holographic lens 322 may have not only a structure having a focusing action in one axis direction but also a structure for focusing at one point with a pattern of concentric circles.

Moreover, the number of photodetector elements is not restricted to four. For example, five photodetector elements PD1, PD2, PD3, PD4, and PD5 can be arranged one-dimensionally as shown in FIG. 17.

Figure 17:
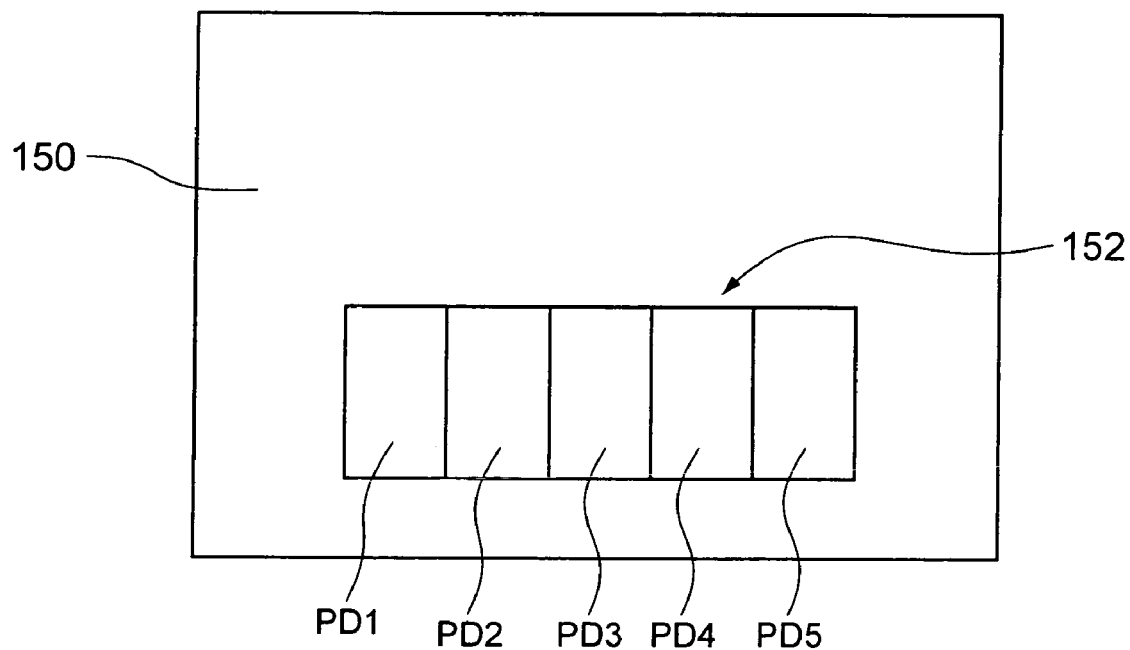
FIG. 17 is a diagram showing a top view of modified example of a photodetector element.

In a structure shown in FIG. 17, a number of procedures for generating the signals VZ, VM12bias, and VRL can be taken into consideration. The signals can be generated according to equations (10) to (13) for example.

$$VZ = V(PD2) - V(PD3) + V\text{ref} \tag{10}$$

$$VM12 = V(PD1) + V(PD5) \tag{11}$$

$$VM12\text{bias} = VM12 + V\text{bias} \tag{12}$$

$$VRL = V(PD2) + V(PD3) + V(PD4) \tag{13}$$

Moreover, in other calculation procedure, the signals may be generated according to equations (14) to (17).

$$VZ = V(PD2) - V(PD3) + V\text{ref} \tag{14}$$

$$VM12 = V(PD1) + V(PD5) \tag{15}$$

$$VM12\text{bias} = VM12 + V\text{bias} \tag{16}$$

$$VRL = V(PD2) + V(PD3) \tag{17}$$

Figure 18:
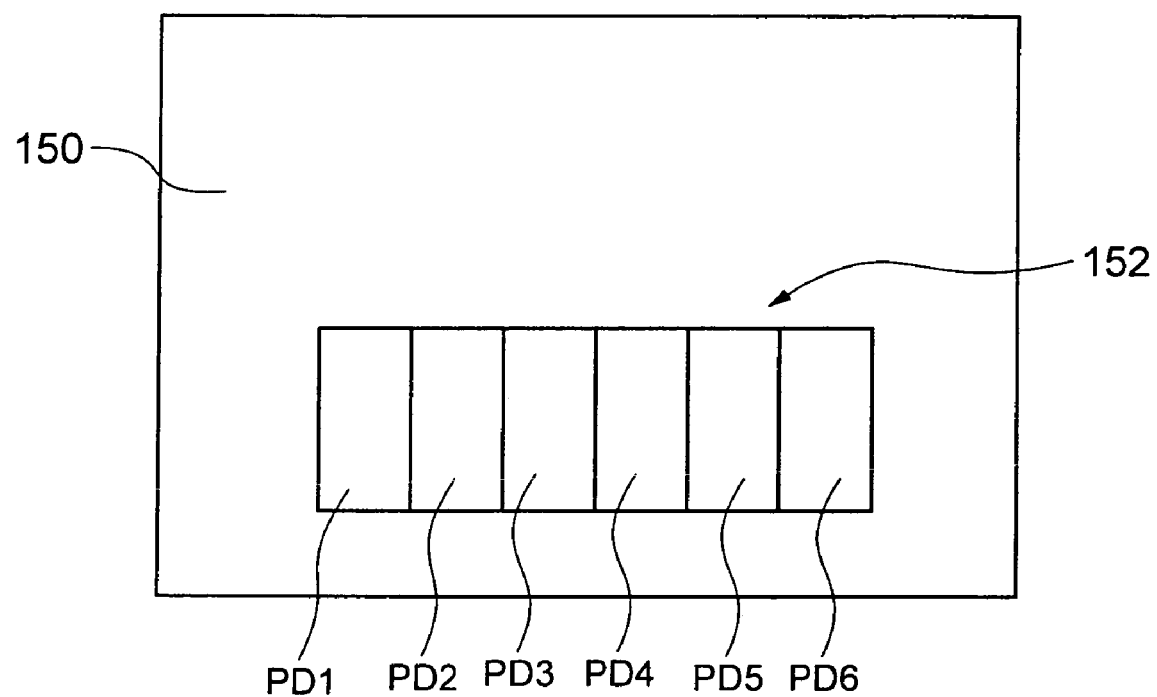
FIG. 18 is a diagram showing a top view of a structure of another modified example of the photodetector element.

Furthermore, for example, six photodetector elements PD1, PD2, PD3, PD4, PD5, and PD6 can also be arranged one-dimensionally as shown in FIG. 18.

In a structure shown in FIG. 18, the signals VZ, VM12bias, and VRL are generated according to equations (18) to (21).

$$VZ=(V(PD2)+V(PD3))-(V(PD4)+V(PD5))+V\text{ref} \quad (18)$$

$$VM12=V(PD1)+V(PD6) \quad (19)$$

$$VM12\text{bias}=VM12+V\text{bias} \quad (20)$$

$$VRL=V(PD2)+V(PD3)+V(PD4)+V(PD4) \quad (21)$$

In the abovementioned procedure, as amplitude of the signal VZ can be increased, an optical encoder strong against noise can be achieved. Moreover, a distance between the photodetector element PD1 and the photodetector element PD6 being far, a width of the gate signal can be increased, and the gate signal can be output stably.

Moreover, the signals may be generated according to the following equation (22) to (25) as examples of other procedure. In this procedure, not all the photodetector elements are used necessarily.

$$VZ=V(PD3)-V(PD4)+V\text{ref} \quad (22)$$

$$VM12=V(PD1)+V(PD6) \quad (23)$$

$$VM12\text{bias}=VM12+V\text{bias} \quad (24)$$

$$VRL=V(PD3)+V(PD4) \quad (25)$$

Moreover, all the photodetector elements need not be of the same size and the same shape. Accordingly, the modifications can be made based on specifications, and number of photodetector elements can be increased freely when deemed appropriate.

Figure 19:
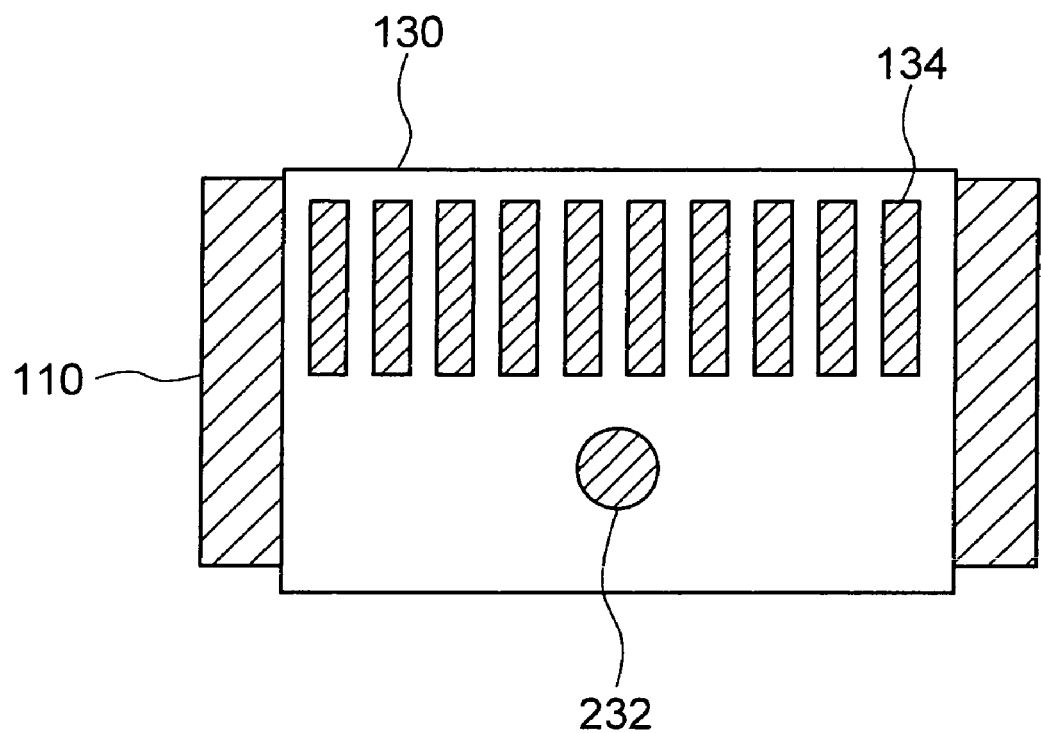
FIG. 19 is a diagram showing a modified example of the aperture.
Figure 20:
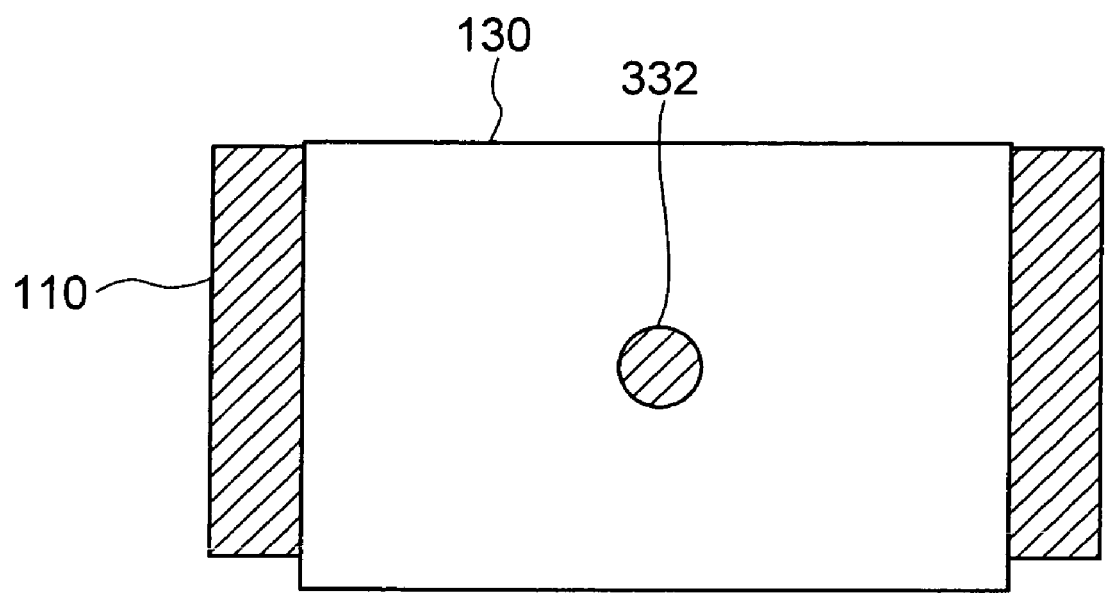
FIG. 20 is a diagram showing another modified example of the aperture.
Figure 21:
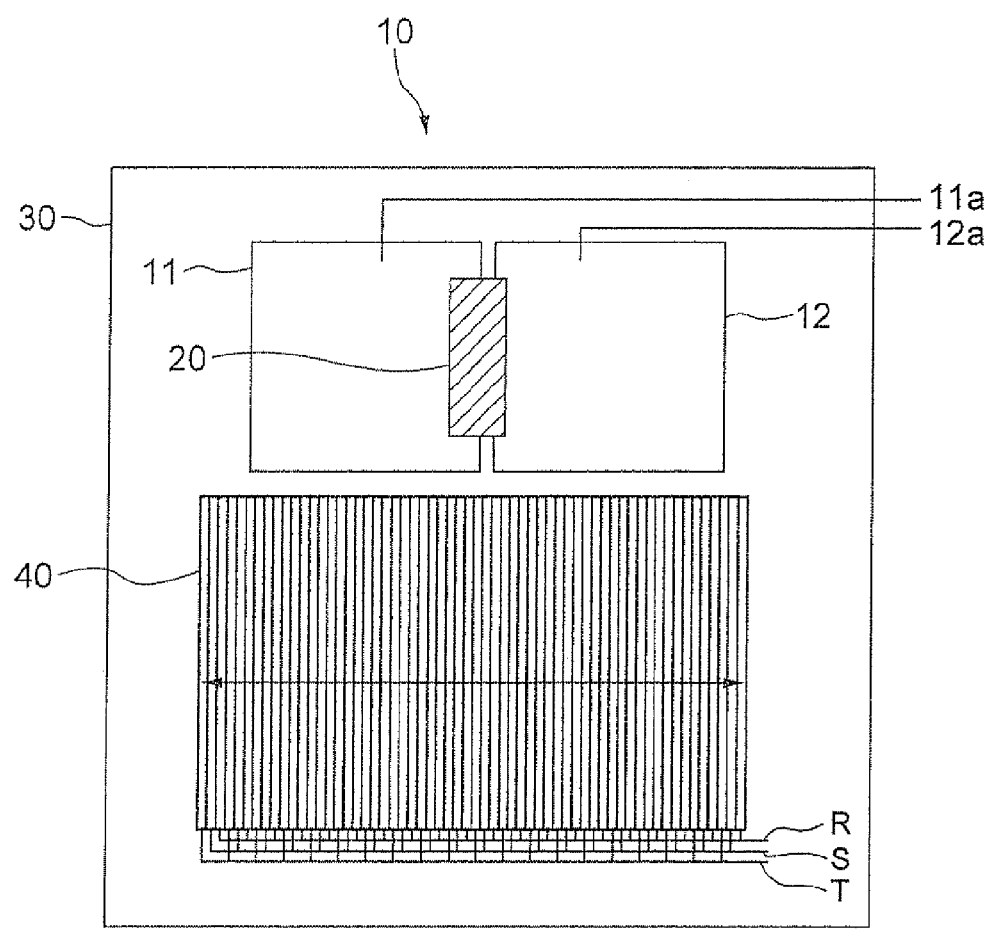
FIG. 21 is a diagram showing a top view of a structure of an optical encoder of a conventional technology.
Figure 22:
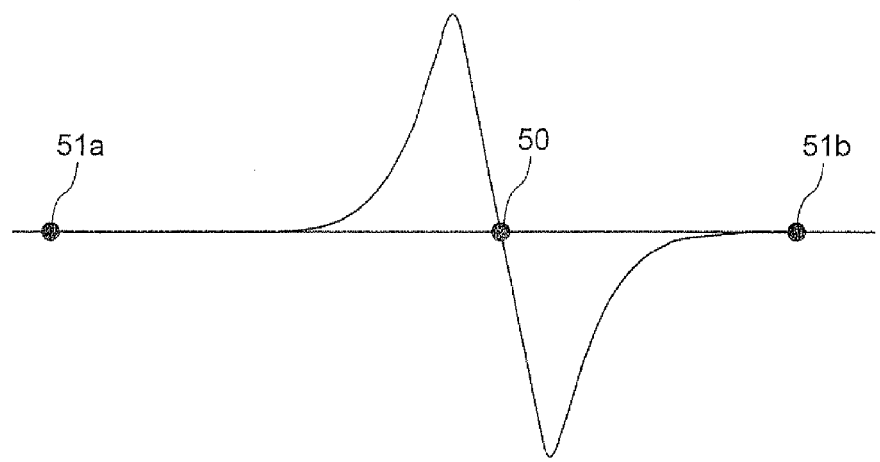
FIG. 22 is a diagram showing an output signal of the conventional technology.

The aperture 134 or the aperture 132 formed in the light source slit 130 can have various modified examples. For example, as shown in FIG. 19, a pin hole 232 instead of the aperture 132 may be formed. Furthermore, as shown in FIG. 20, one pin hole 332 may be let to serve as the two apertures 134 and 132. Furthermore, a slit may be used instead of the pin hole. Thus, the present invention, various modifications which fairly fall within the basic teaching herein set forth, can be made.

Thus, the optical encoder according to the present invention is useful as an optical encoder which can easily output the reference position accurately.

Thus, in the optical encoder according to the present invention, a gate signal forming member generates a gate signal which includes at least an area in which the first differential signal performs zero crossing, near a position where light irradiated from the light source is incident on the photodetector for detecting the reference position via the reference position pattern formed on the scale. Moreover, the reference position signal is output based on the gate signal and a point of zero crossing of the first differential signal. Accordingly, it is possible to easily output the reference position accurately.

What is claimed is:

1. An optical encoder having a reference position detecting function, comprising:
    a light source which irradiates light;
    a scale on which a periodic optical pattern, and at least one reference position pattern are formed, and which moves relatively with the light source;
    a photodetector for detecting the periodic pattern, which detects light which is irradiated from the light source via the periodic optical pattern;
    a photodetector for detecting the reference position, which includes a plurality of photodetector elements arranged one-dimensionally in a direction of movement of the scale, and which detects light irradiated from the light source via the reference position pattern;
    a differential signal calculating member which calculates a first differential signal of an output signal from at least one photodetector element from among the plurality of photodetector elements, and an output signal from at least one other photodetector element different from the one photodetector element; and
    a gate signal forming member which generates a gate signal indicating a reference position neighborhood during a period in which the light emitted from the light source is incident on the photodetector via the reference position pattern formed on the scale for detecting the reference position with a movement of the scale,
    the gate signal forming member calculating a first sum signal which is a sum of output signals from at least two photodetector elements taken from a non-end position among the plurality of photodetector elements arranged one-dimensionally, and a second sum signal which is a sum of output signals from at least two other photodetector elements arranged to sandwich at least the two photodetector elements, the gate signal being output based on the first sum signal and the second sum signal,
    the optical encoder outputting a reference position signal based on a point of zero crossing of the first differential signal and the gate signal during a period in which the gate signal is generated.

2. The optical encoder according to claim 1, wherein the photodetector for detecting the reference position includes four photodetector elements arranged one-dimensionally.

3. The optical encoder according to claim 2, wherein the gate signal is output based on a magnitude correlation of the first sum signal and the second sum signal.

4. The optical encoder according to claim 3, wherein a bias voltage is added to at least one of the first sum signal and the second sum signal such that, in a period during which the gate signal indicating the reference position neighborhood is generated and a period during which the gate signal is not generated, the magnitude correlation of the first sum signal and the second sum signal is reversed.

5. The optical encoder according to claim 2, wherein the gate signal is output based on a magnitude correlation of a second differential signal which is obtained by subtracting the second sum signal from the first sum signal, and a third differential signal which is obtained by subtracting the first sum signal from the second sum signal.

6. The optical encoder according to claim 5, wherein a reference position of the second differential signal and the third differential signal is set such that in a period during which the gate signal indicating the reference position neighborhood is generated and a period during which the gate signal is not generated, a magnitude correlation of the second differential signal and the third differential signal is reversed.

7. The optical encoder according to any one of claims 2 to 6, wherein a size of a receiving portion of the four photodetector elements is substantially same.

8. The optical encoder according to claim 7, wherein a signal current output from the four photodetector elements is convened to voltage by one or more feedback resistors, each feedback resistor having a substantially same resistance.

9. The optical encoder according to any one of claims 2 to 6, wherein the four photodetector elements arranged one-dimensionally include a first photodetector element, a second photodetector element, a third photodetector element, and a fourth photodetector element in an order from one of the end portion sides, and the first differential signal is a differential signal of a sum signal of an output of the first photodetector element and an output of the second photodetector element, and a sum signal of an output of the third photodetector element and an output of the fourth photodetector element.

10. The optical encoder according to claim 9, wherein one dummy photodiode each is connected to at least both end portions of the four photodetector elements arranged one-dimensionally.

11. The optical encoder according to any one of claims 1 to 6, wherein when a light emission center of the light source and a central point of a joining portion of at least one photodetector element and at least another photodetector element from among the plurality of photodetector elements involved in the calculation of the first differential signal are connected by a straight line, the straight line and the direction of movement of the scale are substantially orthogonal mutually.

12. The optical encoder according to claim 11, wherein a slit or a pin hole is formed in an optical path from the light source up to the scale, and the light emission center of the light source is determined by a center of an aperture of the slit or the pin hole.

* * * * *